United States Patent [19]

Mattie

[11] 4,145,905
[45] Mar. 27, 1979

[54] METHOD AND APPARATUS FOR CONTROLLING BOW IN VENETIAN BLIND SLATS

[75] Inventor: Andrew S. Mattie, Montoursville, Pa.

[73] Assignee: Marathon Manufacturing Company, Houston, Tex.

[21] Appl. No.: 856,614

[22] Filed: Dec. 2, 1977

[51] Int. Cl.² ............................................. B21D 1/02
[52] U.S. Cl. ..................................... 72/177; 72/181; 72/179; 72/161
[58] Field of Search .................. 72/177, 179, 181, 161

[56] References Cited

U.S. PATENT DOCUMENTS

| | | | |
|---|---|---|---|
| 2,600,442 | 6/1952 | Stanius | 72/179 X |
| 2,692,003 | 10/1954 | Nieman et al. | 72/179 |
| 3,344,641 | 10/1967 | Pomory | 72/179 X |
| 3,452,568 | 7/1969 | Vihl | 72/181 X |
| 3,535,902 | 10/1970 | Sevenich et al. | 72/161 X |

Primary Examiner—Milton S. Mehr
Attorney, Agent, or Firm—Robert K. Youtie

[57] ABSTRACT

A method and apparatus for correcting bow in crowned strip wherein a pair of complementary rolls receive the crowned strip, one roll of the pair being adjustable toward the other, and the assembly being adjustable transversely of the path of strip movement to correct bow.

13 Claims, 8 Drawing Figures

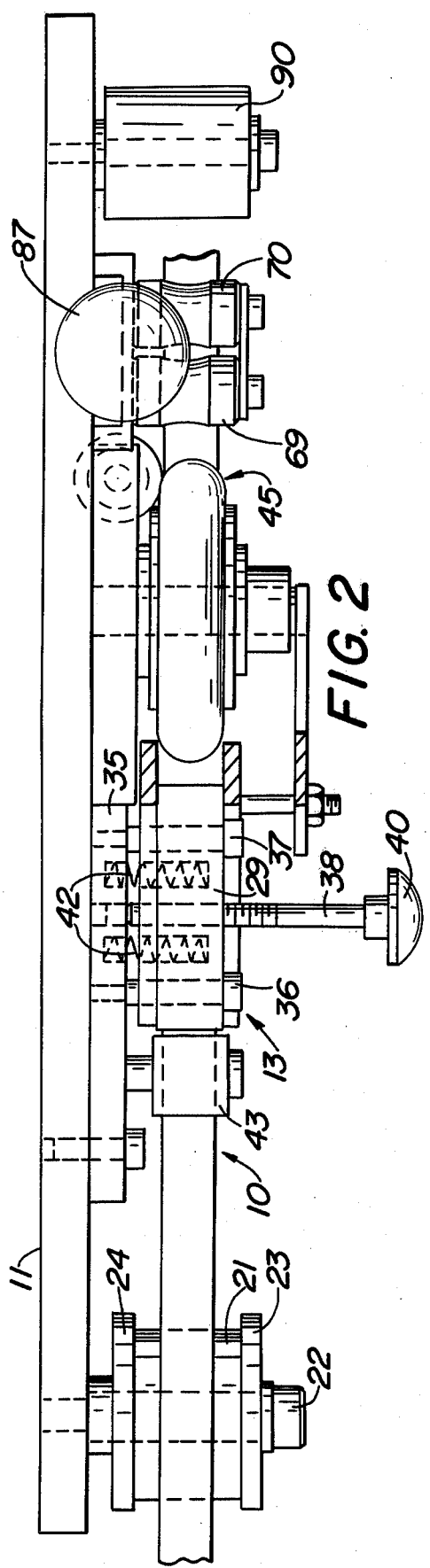
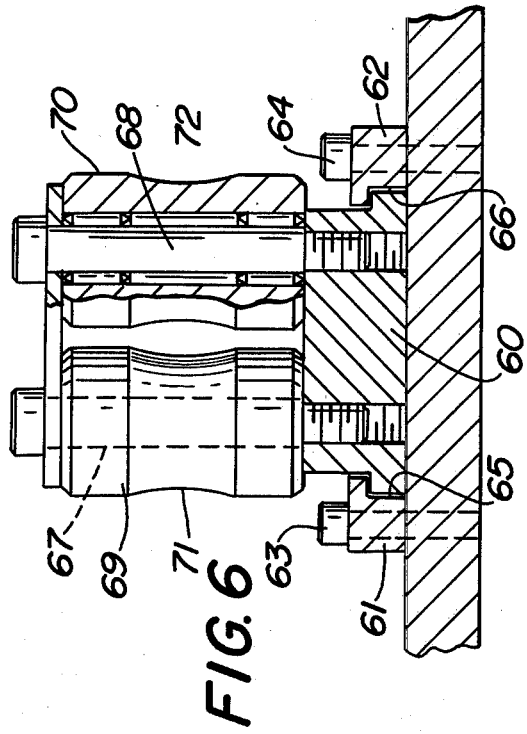
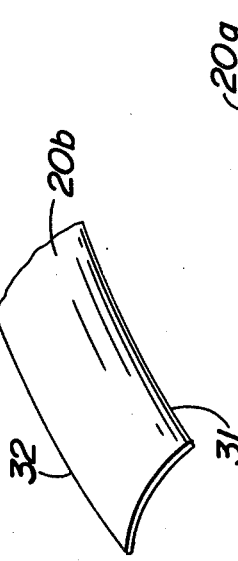
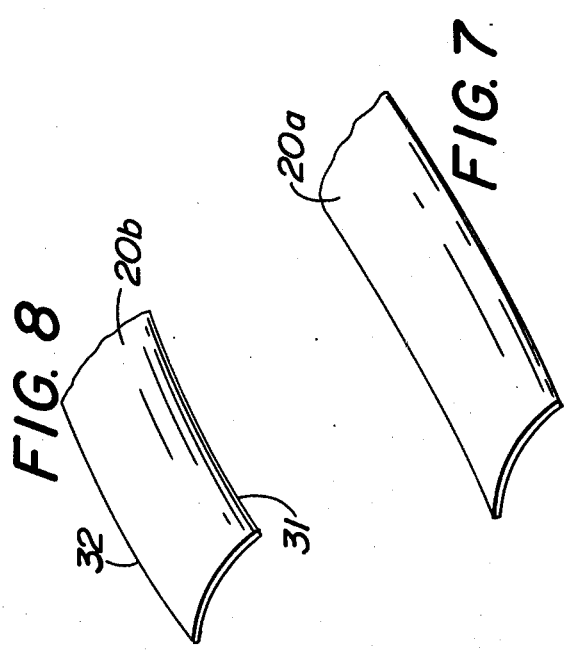

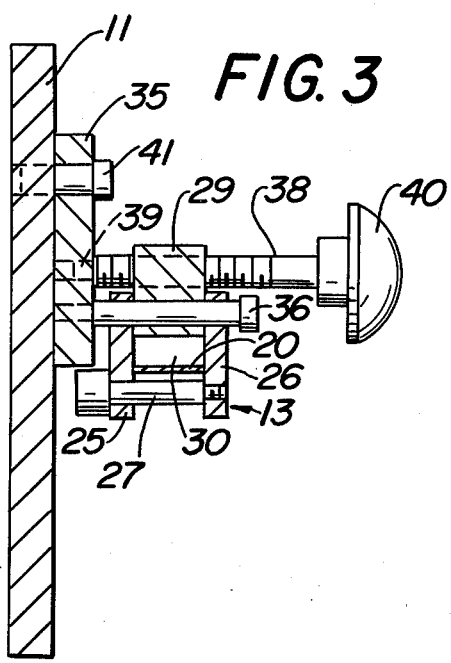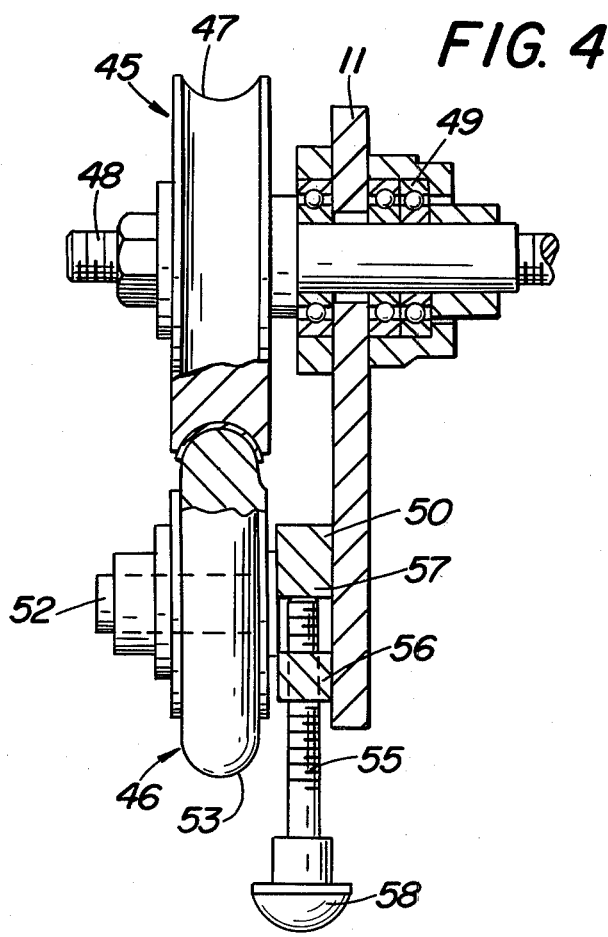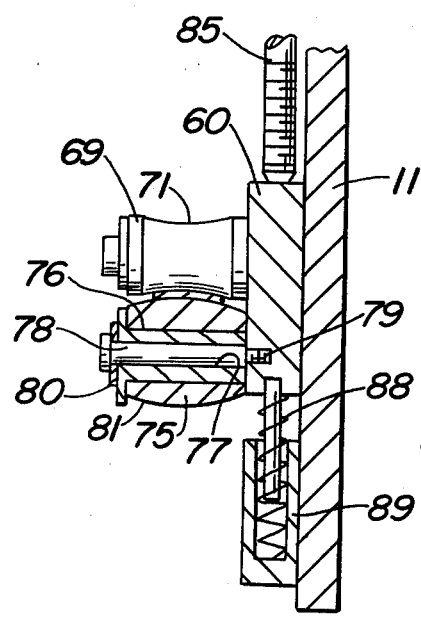

METHOD AND APPARATUS FOR CONTROLLING BOW IN VENETIAN BLIND SLATS

BACKGROUND OF THE INVENTION

As is well known to those versed in the venetian blind art, conventional metal blind slats are subject to certain problems in manufacture, one of which is called bow. In particular, the metal slats are necessarily slightly crowned or transversely arcuate in order to be self-sustaining in their horizontal position between widely spaced ladders. In the trade the term negative bow refers to a crowned slat having its convexly crowned surface longitudinally arcuately concave or bowed. Conversely, positive bow refers to a crowned slat strip having its convex crown surface longitudinally convexly curved.

Heretofore, it has been extremely difficult to avoid, eliminate or minimize bow, prior bow control methods and apparatus being slow, inaccurate and requiring considerable machine down time, without assurance of continued satisfactory slat production.

SUMMARY OF THE INVENTION

Accordingly, it is an important object of the present invention to provide a method and apparatus for controlling or correcting bow in crowned strip material or venetian blind slats, which overcome the above mentioned difficulties, being extremely simple in structure and operation, enabling correction without loss of production by machine stoppage, and wherein are achieved substantial and effective reliability in bow correction.

Other objects of the present invention will become apparent upon reading the following specification and referring to the accompanying drawings, which form a material part of this disclosure.

The invention accordingly consists in the features of construction, combinations and arrangements of parts and method steps, which will be exemplified in the following description, and of which the scope will be indicated by the appended claims.

BRIEF DESCRIPTION OF THE DRAWINGS

FIG. 2 is a top plan view of the apparatus of FIG. 1, partly broken away.

FIG. 3 is a transverse sectional elevational view taken generally along the line 3—3 of FIG. 1.

FIG. 4 is a transverse sectional elevational view taken generally along the line 4—4 of FIG. 1.

FIG. 5 is a transverse sectional elevational view taken generally along the line 5—5 of FIG. 1.

FIG. 6 is a fragmentary horizontal sectional view taken generally along the line 6—6 of FIG. 1.

FIG. 7 is a partial fragmentary perspective view showing a venetian blind slat having negative bow.

FIG. 8 is a partial perspective view showing a venetian blind slat having positive bow.

DESCRIPTION OF THE PREFERRED EMBODIMENT

Figure 1:
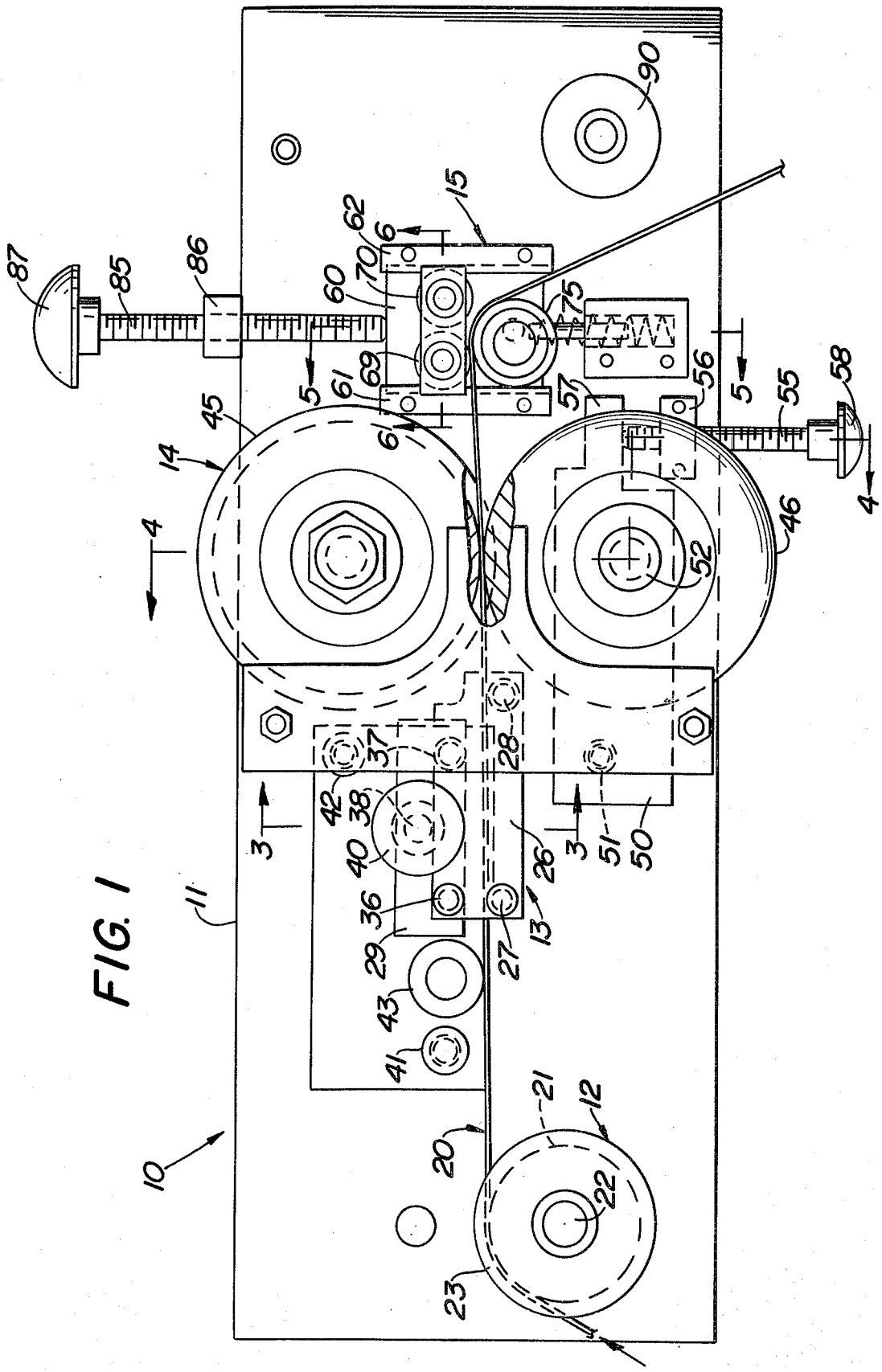
FIG. 1 is an elevational view showing a slat forming apparatus embodying and practicing the method of the present invention.

Referring now more particularly to the drawings, and specifically to FIGS. 1 and 2 thereof, apparatus of the present invention is there generally designated 10, and may comprise a generally vertically disposed mounting member or plate 11 fixedly positioned by any suitable means (not shown). The mounting member or plate 11 may have mounted thereon, at its upstream end, a strip guide member or roll 12, and downstream therefrom a camber control station 13. Downstream from the camber control station 13, also mounted on the plate 11, is a crown forming or rolling station 14, and downstream from the latter, also carried by the plate 11, may be a bow correction station 15. The several stations 12, 13, 14 and 15 combine to define therealong a path of movement of strip material 20 through the apparatus 10 and more specifically, along the mounting plate 11.

More specifically, the strip guiding station or roll 12 may include a generally cylindrical roll or spool 21 on one side of the plate, say the front side thereof, disposed with its axis generally horizontal and mounted on a generally horizontal spindle, axle or shaft 22 for rotation about the axis thereof. The spindle or shaft 22 may be mounted in the plate 11, extending generally horizontally forwardly from the latter. The spool or roll 12 may include circumferential shoulders or flanges 23 and 24 for guiding edge engagement with the strip 20 trained over the roll 21.

The camber control station 13 may include a pair of laterally spaced, longitudinally extending inner and outer side pieces or guide members 25 and 26. The side pieces or guide members 25 and 26 may assume the configuration of parallel spaced, facing bars extending longitudinally of the strip or work 20, downstream of the guide roll 12, and secured in their facing space relation by suitable fastener means, such as a pair of elongate tie members or threaded fasteners 27 and 28 extending laterally between longitudinally spaced lower regions of the side pieces 25 and 26. A spacer member or block 29 is interposed in spacing relation between upper regions of the side members 25 and 26, so that the latter are rigidly connected together in their facing spaced relation, the space therebetween defining a guideway or passage 30 for a purpose appearing presently.

Carried by the support member or plate 11, in facing engagement therewith, is a mounting member or plate 35 located adjacent to the inner side piece or guide member 25. Projecting laterally outwardly from the plate 35, through upper regions of the side pieces 25 and 26 and the intermediate block 29, are a pair of way members or pins 36 and 37 which serve to slidably mount the assembled guide members or side pieces 25 and 26 for lateral shifting movement. The lateral shifting movement of side pieces 25 and 26 is selectively adjustable by means of a manually actuable threaded member 38 extending in threaded engagement through the space or block 29 and having its inner end 39 rotatably captured in the plate 35. Thus, rotation of adjustment member 38, as by manual operation of knob 40, serves to laterally adjustably position the side pieces 25 and 26, as desired.

As best seen in FIG. 3, the strip 20 moves along its longitudinal path through the space 30 between guide members 25 and 26, the lateral extent or internal dimension of space 30 approximating the width of strip 20. Thus, lateral shifting adjustable positioning of the camber control station 13, and specifically of the side pieces 25 and 26, serve to laterally shift the strip 20 passing through the space 30, for purposes appearing more fully hereinafter.

If it is desired to operate the apparatus with a strip of widely differing width, a different camber control station 13 may be quickly and easily substituted, by mere removal of the mounting plate 35 from the support plate 11, and replacement with a similar mounting plate having a larger size camber control station. The mounting plate 35 is removably secured to the support 11 by suitable fastener means, such as bolts 41 and 42. Of course, the camber control station may be provided with suitable size adjustment means to accommodate strips of different width, if desired.

Just upstream of the camber control station 13, mounted on the mounting plate 35, may be an additional guide roll 43 for rolling engagement with the upper side of strip 20 and cooperating with the guide roll 12 to vertically locate the strip for entry into the camber control station 13. If desired, there may be provided resilient means, such as coil compression springs 42 effectively interposed between mounting plate 35 and spacer block 29 to hold the camber control station in its selected position of lateral adjustment, say to take up backlash of threaded engagement between shaft 38 and block 29.

The crown forming or rolling station 14 is just downstream of the camber control station 13 and may include a pair of generally tangential, upper and lower forming rolls 45 and 46. The upper roll 45 may be concave, having a circumferential or peripheral groove 47 of transversely arcuate concave surface configuration. A generally horizontal shaft 48 may mount the upper crowning roll 45, being axially journaled or rotatably supported by suitable bearing means 49 mounted to support member 11. The shaft 48 may extend to a motive source or driving means of any desired type.

Below the upper forming roll 45 and the camber control station 13, and carried by the support plate 11, is a mounting arm 50. That is, the mounting arm or bar 50 extends generally longitudinally along and spaced below the path strip 20, being pivotly connected at one end, as by pivot 51 to the support 11. The pivotal connection 51 is horizontal, to mount the arm 50 for swinging movement about the horizontal axis of the pivot.

Remote from the pivot 51, the arm 50 is provided with a generally horizontally outstanding shaft 52, and journaled thereon is the mating or complementary, lower forming or crowning roll 46. Thus, the lower crowning roll 46, which is provided with a circumferential transversely convex forming surface 53, is swingable with the arm 50 toward and away from its generally tangential relation with respect to the complementary roll 45.

An adjustment member or lead screw 55 is disposed generally vertically and mounted to the support 11 by threaded engagement through a mounting block 56 fixed to the support 11. The adjustment member or screw 55 may have its upper end in bearing engagement with the under side of a free end extension 56 of the arm 50, remote from its pivotal connection 51. Thus, the adjustment member or screw 55 may be rotated, as by manual actuation of knob 58, to swing the arm 50 and selectively position the forming roll 46 toward and away from its mating forming roll 45.

Downstream from the forming station 14, defined by forming rolls 45 and 46, is located the bow control station 15, which includes a generally vertically disposed carrier or plate 60 disposed generally vertically in facing relation with support member or plate 11 and mounted thereon for generally vertical or up and down movement in a pair of generally parallel, spaced guide members or ways 61 and 62, which are fixed to the support plate 11. That is, the guide members or ways 61 and 62 are disposed respectively upstream and downstream of the path of strip movement, and extend generally vertically in parallelism with each other, being fixedly secured to the support 11 by suitable fastener means, as at 63 and 64. The facing sides of the way members 61 and 62 may be undercut, as at 65 and 66 for vertically slidably receiving the carrier 60.

Outstanding generally horizontally from the upper region of carrier 60 are a pair of shafts or pins 67 and 68, being horizontally spaced apart respectively upstream and downstream of the work flow. Rotatably supported or journaled on each pin or shaft 67 and 68 are respective idler rolls 69 and 70, being adjacent to but spaced from each other. The idler rolls 69 and 70 may both have concave peripheral surfaces, as at 71 and 72. The radius of curvature of each surface 71 and 72 may be considerably greater than that of the surfaces 47 and 53 of forming rolls 45 and 47.

An additional roll 75 is mounted for rotation about the generally horizontal axis of a journal bearing or bushing 76 projecting from a lower medial region of the carrier 60. The bushing 76 is externally cylindrical for rotatably supporting the roll 75, and eccentrically mounted, as by an eccentric through hole 77 receiving a pin 78. The pin 78 extends horizontally from the carrier 60, approximately directly beneath the midpoint between upper rolls 69 and 70, having one end, as at 79 threadedly engaged into carrier 60, and having a clamping enlargement 80 for retaining the bushing 76 in a selected position of its eccentric rotation. Thus, upon loosening or slight withdrawal of mounting pin 78, the bushing 76 is rotatable about the eccentric axis of its bore 77, and may be selectively secured at a desired position of its eccentric rotation by retightening of the pin 78 to clamp the bushing against the carrier 60.

This selective adjustment, of course, selectively positions the roll 75 about the eccentric axis of pin 78, which may move the roll 75 toward and away from the roll 69. That is, the axis of rotation of the roll 75 may be selectively positioned toward and away from the roll 69, by rotative adjustment of the bushing 76. Of course, other means may be provided, if desired, to selectively adjust the rolls 75 and 69 toward and away from each other.

It is best seen in FIG. 5, that the external surface 81 of roll 75 is convexly crowned, and of a radius of curvature approximating that of the rolls 69 and 70, so as to be complementary thereto.

The vertical adjustable positioning of the bow control station 15 is achieved by mounting of a vertically adjustable stop member or screw 85 in threaded engagement with a collar 86 fixed to the support 11. An actuating knob 87 may be provided on the upper end of threaded member 85 for rotating the latter to selectively vertically position its lower end for limiting abutting engagement with the upper side of carrier 60. Maintaining this abutting engagement between carrier 60 and threaded shaft 85 may be suitable resilient means such as a coil compression spring 88 interposed in bearing engagement between the under side of carrier 60 and a pocket or receptacle 89 fixed to the support 11.

An additional roller 90 may be provided, for a purpose appearing presently.

In practice of the instant invention, the strip 20 is fed from a coil or stock reel, passing therefrom over the guide roll 12 and under the guide roll 43, to assume a generally horizontal disposition and enter into the space 30 within camber control station 13.

From the camber control station 13, the strip 20 exits generally horizontally into the nip between crown forming rolls 45 and 46 of the crowning station 14. At the crown forming station, the strip 20 is rolled and formed on the generally tangential surfaces 47 and 53 of forming rolls 45 and 46 to generally assume the curvature of surfaces 47 and 53 extending transversely of the strip. This transverse curvature or crown of strip 20 leading the forming station 14 is of greater curvature (less radius of curvature) than desired in the final crowned strip.

Referring now to FIGS. 7 and 8, there is shown a portion of crowned strip material 20a in FIG. 7, wherein the transversely arcuately convex surface is slightly longitudinally concave. In the art this is referred to as negative bow. Stated otherwise, the transversely concave surface of crowned strip 20a is longitudinally convex, and thus of negative bow. Conversely, were the upper or transversely convex surface longitudinally convex and the under or transversely concave surface longitudinally concave, the strip would have positive bow.

In FIG. 8 there is shown a portion of crowned strip 20b, wherein the strip is laterally arcuate, say having one side edge 31 concave and the opposite side edge 32 convex. This lateral curvature is designated camber, which is desirably absent or minimized.

As the strip material is positively gripped in the nip or tangential region of forming rolls 45 and 46, the camber control station 13 operates on the strip therein to deflect and deform the latter laterally against the gripped or held region being crowned. For example, if the output of the apparatus 10 shows camber, the operator adjusts the camber control station 13 by rotation of knob 40 to shift the guide members 25 and 26 laterally in the direction and amount sufficient to correct and remove the undesired camber. Thus, it is necessary to check the machine output periodically for camber, and to correct the same in the manner described hereinbefore.

Exiting from the forming station 14, the strip 20 is relatively stiff by reason of the substantial crowning and passes between the generally tangential rolls 69 and 75. Specifically, with the crowned strip engaging the under side of upstream roll 69 and complementary lower roll 75, the lower roll is adjusted toward the upper roll, as by swinging the center of rotation of the lower roll about its eccentric mounting pin 78 to effect a tangential nip or biting action with the intermediate portion of strip 20. By the transverse curvatures of surfaces 71 and 81 of rolls 69 and 75, respectively, having larger radii than the entering crowned strip material, the curvature or crowning of the strip material is reduced to substantially that of the curvature of rolls 69 and 75, as in the desired finished product.

After passing between the nip or rolls 69 and 75, the strip engages the under side of downstream upper roll 70, and is thereby deflected downwardly, as by flexure of the strip to assume a storage loop for withdrawal and rewinding.

The carrier 60 of bow control station 15 may be initially vertically positioned so that the crowned strip extends generally horizontally from the forming station to the bow control station. As there is often slight positive bow in the finished strip, as from the coil set or set of the strip from the supply coil, the initial horizontal extension of the strip exiting the forming station will serve to correct the positive bow, by reason of the lower bow control roll 75 being slightly downstream of the upper bow control 69. That is, with the bow control carrier 60 vertically located so that the crowned strip extends generally horizontally from the forming station 14, the complementary rolls 69 and 75 effect a slight tensioning or longitudinal distention of the strip edges and simultaneous longitudinal compression of the medial strip region to remove slight positive bow.

In order to remove additional positive bow, the carrier 60 of bow control station 15 is adjusted vertically downwardly, by rotation of stop member 85. It will be appreciated that this will impart additional longitudinal tension and extension of the strip edges, and a longitudinally compressive force to the medial strip region.

Conversely, should the resultant product have negative bow, the carrier 60 of bow control station 15 will be shifted vertically upwardly to increase tension and resultant extension along the longitudinally medial region, and to increase compression along the strip edge regions. It is only necessary to gradually adjust the bow control carrier 60 in one direction or the other, as indicated, and examine product to ascertain the proper setting.

Thus, bow control is effected by passing the crowned strip between or through the nip of crowned bow control rolls 69 and 75, and displacing the control rolls generally radially of the strip crown in the proper direction to correct strip bow. As the strip is overcrowned by the forming rolls 45 and 46, the strip portion extending from the forming rolls is sufficiently stiffened or rigidified to permit bow correction at the station 55 without flexure of the strip between the forming and bow control stations. However, it will be observed, as in FIGS. 4 and 5, that crown forming at the station 14 is performed between the surfaces 47 and 53 which in no way constrain or engage the edges of the work strip. Similarly, in FIG. 5, the crown or curvature is reduced by the surfaces 71 and 81 of complementary rolls 69 and 75 which are also configured so as to in no way constrain or engage the edges of the strip being worked. By this complementary configuration of forming rolls 45 and 46 and bow correction rolls 69 and 75, wherein both strip edges are left entirely unconstrained, it has been found advantageously possible to work prepainted strip material with little or no adverse affect to the painting.

While it has been found entirely satisfactory to permit free rotation of the several bow control rolls 69, 70 and 75, this may be otherwise, if desired. In addition to the absence of edge contact at the forming station 14 and bow control station 15 resulting in an improved paint coating, the absence of edge contact with rolls has substantially reduced roll wear and greatly increased roll life.

From the foregoing, it is seen that the present invention provides a method and apparatus for correcting bow in crowned strip, as well as correcting camber, which also greatly improves the strip finish and is extremely simple and reliable in use, requiring relatively little supervision, and effecting substantial economies by speeding production, reducing downtime and minimizing rejects.

Although the present invention has been described in some detail by way of illustration and example for purposes of clarity of understanding, it is understood that certain changes and modifications may be made within the spirit of the invention.

What is claimed is:

1. In the method of correcting bow in crowned strip material without completely removing the crown, the steps which comprise: rolling the strip through crowned forming rolls to crown the strip, simultaneously passing the crowned strip just downstream of and directly from the crown forming rolls through the nip of crowned control rolls, and displacing said control rolls in a selected direction generally parallel to radii of the crown forming rolls to correct bow.

2. The method according to claim 1, further characterized in rolling the strip to crown the same with a crown of sufficiently small radius of curvature to maintain stiffness on passing to the control rolls.

3. The method according to claim 2, further characterized in removing some crown from said strip at said control rolls.

4. The method of correcting bow in crowned strip material, which comprises: rolling the strip to crown the same, passing the crowned strip through the nip of crowned control rolls, and displacing said control rolls in a selected direction generally radially of the crown to correct bow, said crown being partially removed by passing said strip through the nip of control rolls having less crown than the crowned strip.

5. The method according to claim 1, further characterized in flexing the bow corrected strip into a storage loop.

6. In the method of correcting bow in crowned strip material, the steps which comprise: rolling the strip to crown the same, passing the crowned strip through the nip of crowned control rolls, and displacing said control rolls in a selected direction generally radially of the crown to correct bow, further characterized prior to crowning in displacing said strip laterally in a selected direction to correct camber.

7. The method according to claim 6, further characterized in displacing said strip laterally just upstream of rolling said strip to crown the same.

8. The method according to claim 1, further characterized in effecting said crown rolling and bow correcting without constraining the strip edges.

9. Apparatus for correcting bow in crowned strip, said apparatus comprising crown forming rolls for longitudinally feeding crowned strip along a path, a pair of complementary positively and negatively crowned control rolls on opposite sides of and generally tangent to said path for conforming engagement with the crowned strip, and mounting means mounting said control rolls for movement in a selected direction generally parallel to radii of the crown forming rolls to correct bow.

10. Apparatus for correcting bow in crowned strip, said apparatus comprising feeding means for longitudinally feeding crowned strip along a path, a pair of complementary positively and negatively crowned rolls on opposite sides of and generally tangent to said path for conforming engagement with the crowned strip, mounting means mounting said rolls for movement in a selected direction generally radially of the strip crown to correct bow, said feeding means comprising crown forming rolls, and a strip guide upstream of said crown forming rolls mounted for movement to displace said strip laterally in a selected direction for correcting camber.

11. Apparatus for correcting bow in crowned strip, said apparatus comprising feeding means for longitudinally feeding crowned strip along a path, a pair of complementary positively and negatively crowned rolls on opposite sides of and generally tangent to said path for conforming engagement with the crowned strip, and mounting means mounting said rolls for movement in a selected direction generally radially of the strip crown to correct bow, said feeding means comprising crown forming rolls, said crown forming rolls having relatively short radii of crown forming curvature to form a crown configuration greater than that ultimately desired affording sufficient stiffness for working in correcting bow.

12. Apparatus according to claim 11, said pair of complementary crowned rolls having radii of crown curvature greater than that of said crown forming rolls to reduce the crown in the bow corrected strip.

13. Apparatus according to claim 9, in combination with additional mounting means mounting said pair of complementary crowned rolls for adjustable movement toward and away from each other for nip engagement with the crowned strip, said additional mounting means comprising an eccentric pivot journaling one of said pair of complementary rolls.

* * * * *